United States Patent
Takahashi et al.

(10) Patent No.: US 7,215,168 B2
(45) Date of Patent: May 8, 2007

(54) WIDENING JITTER MARGIN FOR FASTER INPUT PULSE

(75) Inventors: Hisao Takahashi, Kanagawa (JP); Toru Takai, Tokyo (JP)

(73) Assignee: Tektronix International Sales GmbH, Schaffhausen (CH)

( * ) Notice: Subject to any disclaimer, the term of this patent is extended or adjusted under 35 U.S.C. 154(b) by 0 days.

(21) Appl. No.: 11/231,412

(22) Filed: Sep. 20, 2005

(65) Prior Publication Data
US 2006/0066371 A1  Mar. 30, 2006

(30) Foreign Application Priority Data
Sep. 24, 2004 (JP) ............... 2004-278568

(51) Int. Cl.
*H03K 3/017* (2006.01)
(52) U.S. Cl. ...................... 327/175; 327/172
(58) Field of Classification Search ............... 327/261, 327/263, 34, 551, 172–175
See application file for complete search history.

(56) References Cited

U.S. PATENT DOCUMENTS

| | | | | |
|---|---|---|---|---|
| 5,889,435 A | * | 3/1999 | Smith et al. | 331/1 A |
| 6,518,809 B1 | * | 2/2003 | Kotra | 327/175 |
| 6,737,927 B2 | * | 5/2004 | Hsieh | 331/74 |
| 6,998,893 B2 | * | 2/2006 | Takahashi et al. | 327/170 |

* cited by examiner

*Primary Examiner*—Dinh T. Le
(74) *Attorney, Agent, or Firm*—William K. Bucher

(57) ABSTRACT

A pulse delay circuit induces lager jitter to faster input reference pulse trains than before. A buffer receives a reference pulse train and provides non-inverted and inverted pulses. Low pass filters (LPF) and comparators receive the non-inverted and inverted pulses from the buffer and provide pulses having delayed leading and trailing edges. Dividers divide the delayed pulses by 2 to produce the respective pulse trains having a half frequency. An XOR gate produces an exclusive OR of the delayed and divided pulse trains to provide a pulse train having delayed leading and/or trailing edges relative to the reference pulse train. If the delays by the LPFs and comparators are changed, the output pulses from the XOR gate have jitter.

3 Claims, 4 Drawing Sheets

WIDENING JITTER MARGIN FOR FASTER INPUT PULSE

BACKGROUND OF THE INVENTION

The present invention relates generally to a pulse delay circuit that delays edges of an input pulse train and more specifically to a pulse delay circuit for geneting a high speed jittered test signal.

Digital circuits in electric instruments process a plurality of pulses of a pulse train that may not be ideal due to phase variations in the leading and/or trailing edges of the pulses due to outside noise or the like. The phase variations in the leading and/or trailing edges of pulses in a pulses train is referred to in the electronics industry as jitter. Therefore, digital circuits need to be designed to work in the presence of jitter on the leading edges and/or trailing edges of the pulses. It is desirable to inspect a prototype circuit by providing a jittered pulse train to the circuit to confirm that it works in the presence of a jittered signal. This inspection is called a jitter tolerance test.

For a jitter tolerance test, a jittered test signal (pulse train) is necessary. The jittered test signal is produced by inducing jitter to the leading and/or the training edges of a normal pulse train (called a reference pulse train hereinafter). The jittered est signal is then provided to the digital circuit under test. The jitter tolerance test is performed by comparing the jittered pulse train to the normal pulse train. To induce jitters to the leading and/or trailing edges, delays are provided to the desired edges of the reference pulse train and then the delays are continuously changed.

Japanese patent publication No. 2004-236279 corresponding to US Publication No. 2004/0135606 discloses a prior art example of a jitter addition circuit. The jitter addition circuit receives a reference pulse train which is alternately coupled to two delay blocks. Each delay block has a pulse delay circuit receiving delay values which provide delays to the leading and/or training edges of the reference pulse train. The delay values of each pulse delay circuit are changed while the delay block is not receiving the pulse train. The delay values of the pulse delay circuits are changed so that the leading and/or training edges output pulse train can contain various levels of jitter.

FIG. 1 shows a block diagram of the pulse delay circuit in each of delay blocks and FIG. 2 shows a timing chart of the waveforms that the circuit provide. A buffer 10 receives a reference pulse train and provides non-inverted and inverted output pulse train outputs to low pass filters (LPF) 12 and 14. The LPFs 12 and 14 remove high frequency components of the non-inverted and inverted pulse trains resulting in the pulses having ramping leading and trailing edges. Comparators 16 and 18 receive the ramped pulses of the pulse trains from the LPFs 12 and 14 and compare them with the respective reference voltages $V_{REF1}$ and $V_{REF2}$. The resulting output pulse trains from the comparators 16 and 18 have modified edge positions relative to the reference pulse train as shown in FIGS. 2d and 2e. The LPFs 12 and 14 and comparators 16 and 18 work as delay means. One-shot pulse circuits 20 and 22 convert the pulses from the comparators 16 and 18 into one-shot pulses. This prevents both the S and R input pulses to an SR flip-flop 24 from becoming high at the same time to prevent the SR flip-flop 24 from becoming unstable.

The reference voltages $V_{REF1}$ and $V_{REF2}$ control the leading edge positions of the one-shot pulses from the one-shot pulse circuits 20 and 22. The leading edge of the one-shot pulses from the one-shot pulse circuit 20 determines the leading edge positions of the pulses from the Q output of the SR flip-flop 24 and the leading edge of the one-shot pulses from the one-shot pulse circuit 22 determines the trailing edge positions of the pulses from the Q output of the SR flip-flop 24 . Therefore, continuous variations of the reference voltages $V_{REF1}$ and $V_{REF2}$ lead to continuous position changes of the edges of the output pulse of the SR flip-flop 24, which provides a pulse train having jitter relative to the input reference pulse train.

As described, the voltages $V_{REF1}$ and $V_{REF2}$ change the timing of the edges of the two one-shot pulses provided to the S and R inputs of the SR flip-flop 24. This timing is changing during the jitter being induced so that the one-shot pulses must be controlled so as not to overlap to prevent the S and R inputs from being high at the same time. The SR flip-flop also has setup and hold times which must be considered. That is, the setup and hold times of the SR flip-flop and the pulse width of the one shot pulse restrict a margin of the jitter. Therefore, what is desired is to widen the jitter margin and induce larger jitter to a faster input pulse train.

SUMMARY OF THE INVENTION

The present invention relates to a pulse delay circuit. A buffer receives a reference pulse train and provides non-inverted and inverted pulses. First and second delay means delays the non-inverted and inverted pulses respectively. First and second dividers divide the delayed non-inverted and inverted pulses respectively. An XOR gate means produces an exclusive OR of the divided pulses from the respective first and second dividers. Leading and trailing edges of one of the dividers decide leading edges of the output pulses of the XOR gate and leading and trailing edges of the other of the dividers decide trailing edges of the output pulses of the XOR gate. Then jitter margin (variable delay amount) of the pulse delay circuit according to the present invention is not restricted by a width of one-shot pulse, setup and hold times of an output flip-flop.

The objects, advantages and other novel features of the present invention are apparent from the following detailed description when read in conjunction with the appended claims and attached drawings.

DETAILED DESCRIPTION OF THE INVENTION

Figure 3:
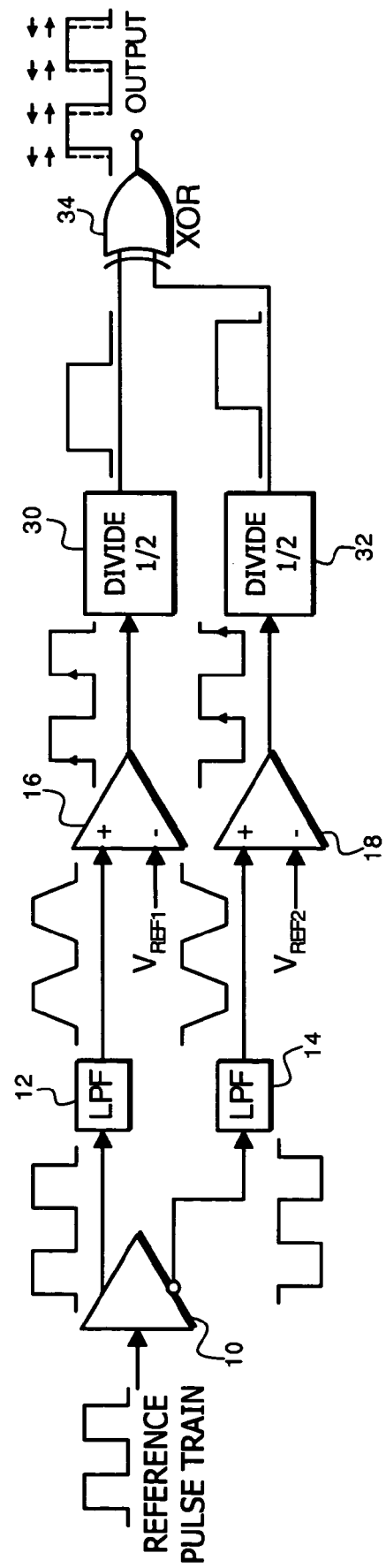
FIG. 3 is an example of a block diagram of a pulse delay circuit according to the present invention.

In the present invention, the one-shot pulse circuits 20 and 22 and the SR flip-flop 24 are replaced by divider circuits 30 and 32 and an exclusive OR Circuit (XOR) 34 as shown in FIG. 3 to produce a jittered pulse train. This circuit has a greater margin of jitter by not being limited by the width of the one-shot pulses of the one-shot pulse circuits 20 and 22 and setup and hold times of the SR flip-flop 24 of the prior art circuit.

Figure 1:
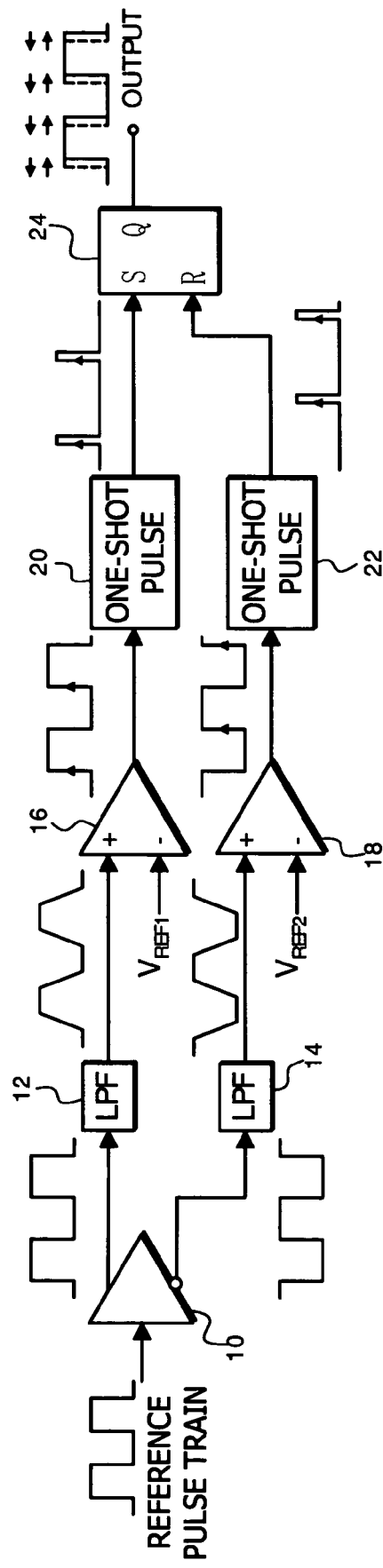
FIG. 1 is a block diagram of a conventional pulse delay circuit.
Figure 2:
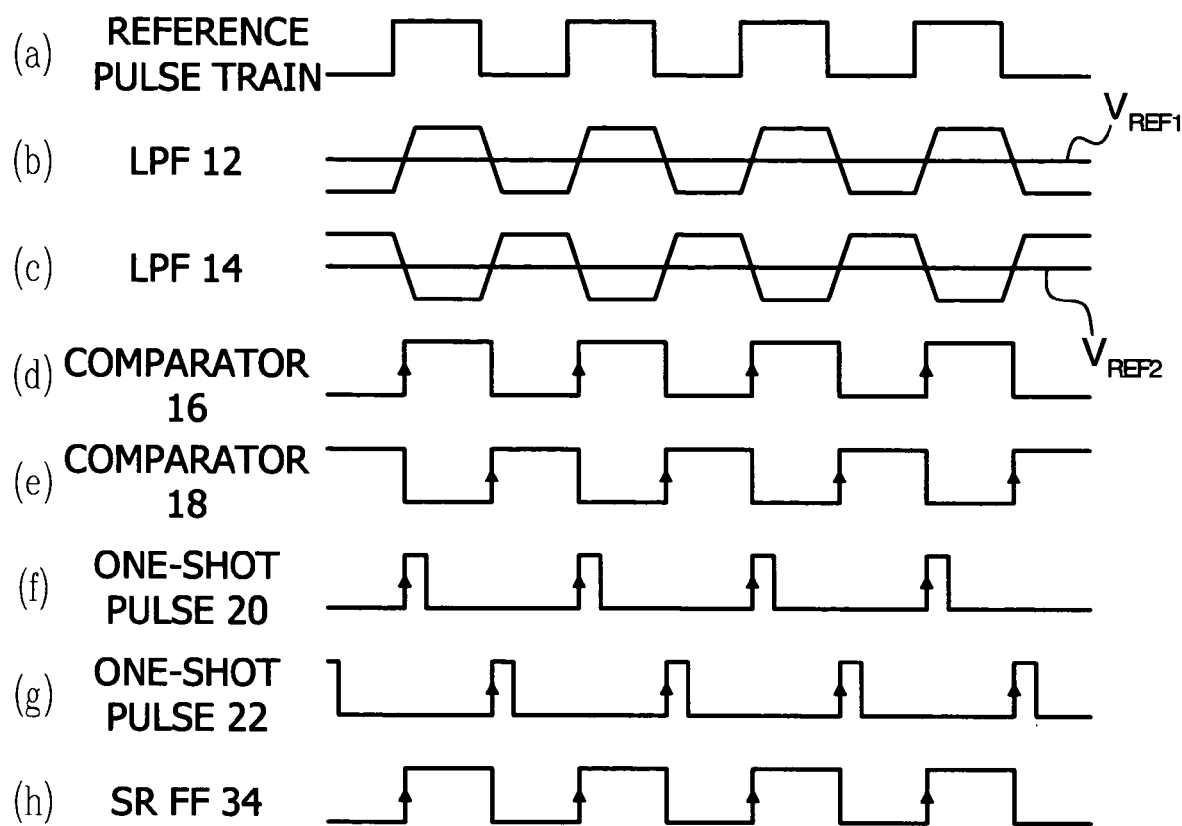
FIG. 2 is a timing chart of outputs from circuits in the pulse delay circuit shown in FIG. 1.

A pulse delay circuit according to the present invention is incorporated into a signal generator instrument, such as an arbitrary waveform generator or the like, that includes a microprocessor, RAM memory, hard disk drive (HDD), keyboard, and the like, which are not shown. The signal generator operates under program control including the pulse delay circuit using programs stored in the RAM memory or on the hard disk drive. In the following descriptions, like elements from FIG. 1 are labeled the same in FIG. 3.

Figure 4:
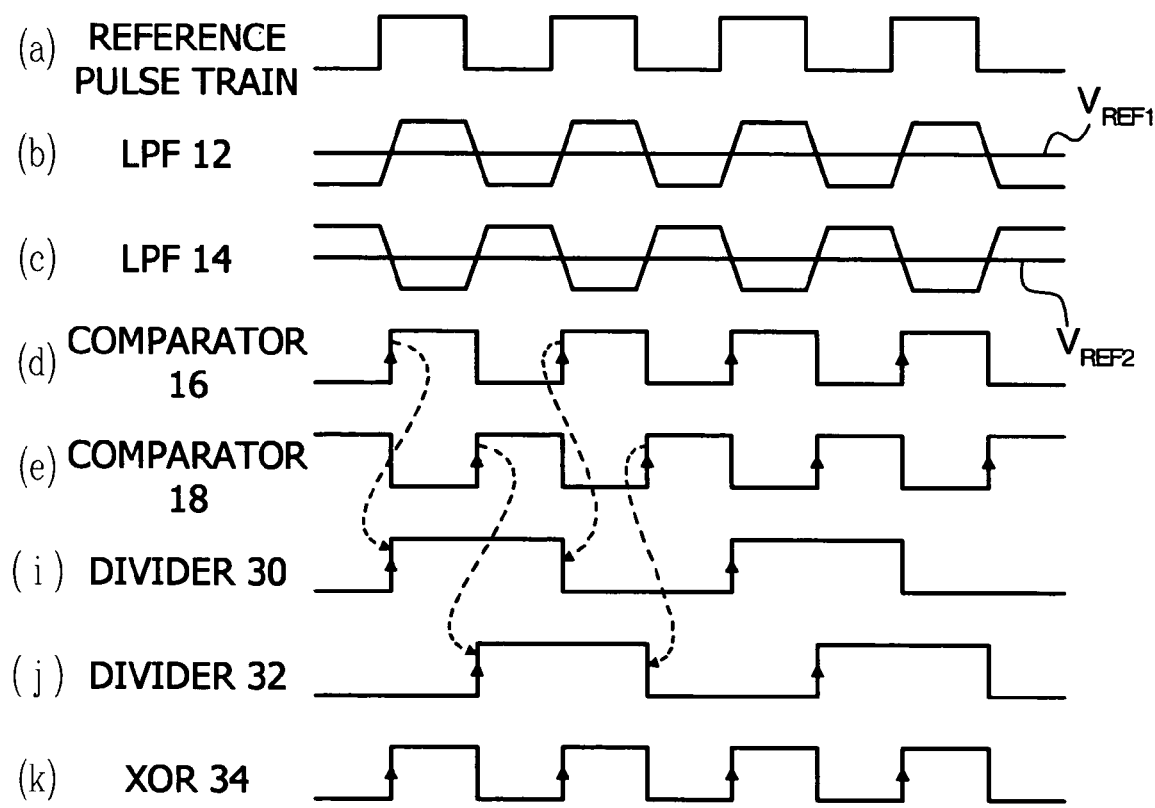
FIG. 4 is a timing chart of outputs from circuits in the pulse delay circuit according to the present invention.

Referring to FIG. 3, a buffer 10 receives a reference pulse train and provides non-inverted pulses to a low pass filter (LPF) 12 and inverted pulses to low pass filter (LPF) 14. The LPFs 12 and 14 remove high frequency components of the non-inverted and inverted pulse trains resulting in the pulses having ramping leading and trailing edges. Comparators 16 and 18 compare the edge-ramped pulse trains from the LPFs 12 and 14 with the respective reference voltages $V_{REF1}$ and $V_{REF2}$. This process delays the edge positions of the pulses relative to the input reference pulse train as shown in FIGS. 4d and 4e. That is, the LPFs and comparators work as delay means. This is similar to the pulse delay circuit shown in FIG. 1.

Referring to FIG. 3 and FIGS. 4i–4k, dividers 30 and 32 divides the pulse trains from the respective comparators 16 and 18 by 2. That is, the outputs of the dividers 30 and 32 change between high and low every time the leading edges of the input pulses arrive from the respective comparators 16 and 18. An XOR circuit 34 produce an exclusive OR of the divided output pulses from the dividers 30 and 32. In this example, the leading and trailing edges of the pulses from the divider 30 decide leading edge positions of the output pulses of the XOR circuit 34, and the leading and trailing edges of the pulses from the divider 32 decide trailing edge positions of the output pulses of the XOR circuit 34.

The positions of the leading and trailing edges of the pulses from the dividers 30 and 32 are independently changed by changing the respective reference voltages $V_{REF1}$ and $V_{REF2}$ so that the delays of the leading and trailing edges of the output pulses from the XOR circuit 34 are also independently changed by controlling the respective $V_{REF1}$ and $V_{REF2}$. That is, continuous change of the $V_{REF1}$ and $V_{REF2}$ produce a pulse train having jitter at the leading and trailing edges. If a plurality of the circuits shown in FIG. 3 are cascaded, it will produce a pulse train having lager jitter.

As described, the present invention uses divide by circuits and an XOR gate that produces an exclusive OR of delayed and divided pulse trains so that jitter margin (variable delay range) is not limited by a width of the pulses of the one-shot pulse circuits and the setup and hold times of the SR flip-flop as in the prior art. Therefore it is suitable for receiving faster reference pulse trains than before and induce larger jitters to the leading and/or trailing edges of the reference pulse train.

What is claimed is:

1. A pulse delay circuit comprising:
    means for receiving a reference pulse train and generating non-inverted and inverted pulses;
    first and second delay means for delaying the respective non-inverted and inverted pulses wherein delays of the first and second delay means modify leading and trailing edge positions of the non-inverted and inverted pulses;
    first and second dividing means for dividing the respective delayed non-inverted and inverted pulses; and
    an exclusive OR gate producing an exclusive OR of the divided pulses from the the first and second dividing means to generate a pulse train having pulses with induced jitter on the leading and trailing edge positions of the pulses.

2. The pulse delay circuit recited in claim 1 wherein each delay means comprises a low pass filter receiving the reference pulse train and generating ramped edges, and a comparator comparing the ramped edges of the pulses and a reference level.

3. The pulse delay circuit recited in claim 2 wherein the reference level of each delay means is changed to induce jitter on the leading and trailing edge positions of the pulses of the pulse train at the output of the exclusive OR gate.

* * * * *